United States Patent
Mongia et al.

(10) Patent No.: US 7,272,006 B2
(45) Date of Patent: Sep. 18, 2007

(54) IC COOLANT MICROCHANNEL ASSEMBLY WITH INTEGRATED ATTACHMENT HARDWARE

(75) Inventors: Rajiv K. Mongia, Fremont, CA (US); Himanshu Pokharna, San Jose, CA (US); Eric DiStefano, Livermore, CA (US); Shawn S. McEuen, Portland, OR (US); Brian A. Wilk, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 152 days.

(21) Appl. No.: 11/239,957

(22) Filed: Sep. 30, 2005

(65) Prior Publication Data

US 2007/0076374 A1    Apr. 5, 2007

(51) Int. Cl.
    *H05K 7/20* (2006.01)
(52) U.S. Cl. .............. 361/702; 361/699; 361/719; 165/80.4; 257/714
(58) Field of Classification Search .......... 361/689, 361/698–703, 707–710, 714–719; 165/80.3, 165/80.4, 41, 185, 171, 108, 47, 104.21, 165/104.25, 168, 179, 169; 257/714–718; 29/890.03, 890.038, 890.04; 62/259.2
    See application file for complete search history.

(56) References Cited

U.S. PATENT DOCUMENTS

| | | | |
|---|---|---|---|
| 5,099,311 A | 3/1992 | Bonde et al. | |
| 5,099,910 A * | 3/1992 | Walpole et al. | 165/80.4 |
| 5,904,424 A | 5/1999 | Schwesinger et al. | |
| 6,301,109 B1 * | 10/2001 | Chu et al. | 361/690 |
| 6,679,315 B2 * | 1/2004 | Cosley et al. | 165/80.4 |
| 6,796,370 B1 * | 9/2004 | Doll | 165/80.4 |
| 6,992,382 B2 * | 1/2006 | Chrysler et al. | 257/717 |
| 2002/0079095 A1 | 6/2002 | Davies et al. | |
| 2004/0069451 A1 | 4/2004 | Meyer | |
| 2005/0141195 A1 | 6/2005 | Pokharna et al. | |
| 2006/0096738 A1 * | 5/2006 | Kang et al. | 165/80.4 |
| 2006/0226539 A1 | 10/2006 | Chang et al. | |

OTHER PUBLICATIONS

"PCT International Search Report of the International Searching Authority", mailed Feb. 19, 2007, for PCT/US2006/037577, 4 pgs.

* cited by examiner

*Primary Examiner*—Michael Datskovskiy
(74) *Attorney, Agent, or Firm*—Buckley, Maschoff & Talwalkar LLC

(57) ABSTRACT

An apparatus includes a microchannel structure that has microchannels formed therein. The microchannels are for transporting a coolant and are intended to be proximate to an integrated circuit to transfer heat from the integrated circuit to the coolant. The apparatus further includes a cover positioned on the microchannel structure. The cover has formed therein a right-angle passage to provide fluid communication between a first port on a lower horizontal surface of the cover and a second port on a vertical surface of the cover. The cover includes a plurality of tabs. Each tab extends from a respective corner of the cover. The tabs each have an aperture formed therein. The apertures are shaped and sized to receive a fastener.

8 Claims, 6 Drawing Sheets

IC COOLANT MICROCHANNEL ASSEMBLY WITH INTEGRATED ATTACHMENT HARDWARE

BACKGROUND

As microprocessors advance in complexity and operating rate, the heat generated in microprocessors during operation increases and the demands on cooling systems for microprocessors also escalate. Cooling systems for microprocessors have been proposed in which a coolant such as water is circulated through narrow channels (known as "microchannels") which are close to or formed in the microprocessor die. One issue that may be encountered in microchannel cooling systems is potential difficulty in connecting tubes for the coolant path to the cover of a microchannel assembly.

DETAILED DESCRIPTION

Figure 1:
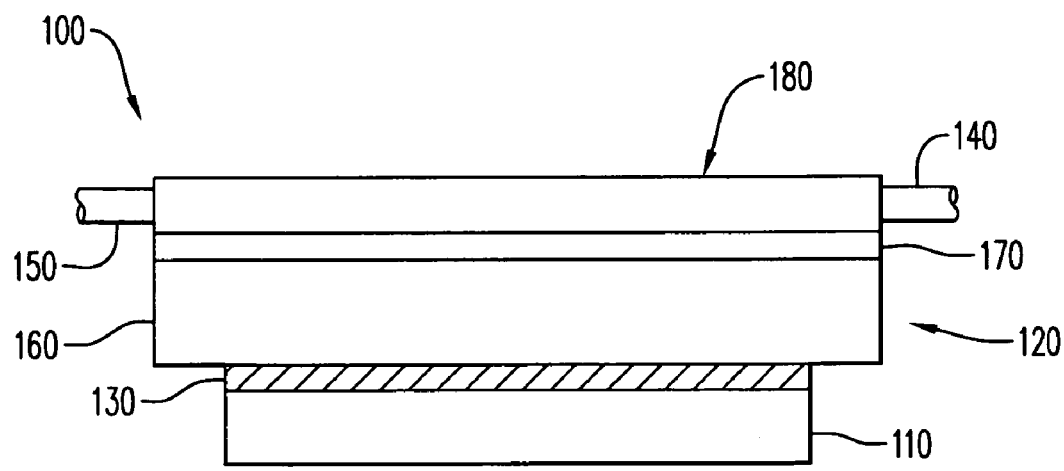
FIG. 1 is a schematic side cross-sectional view of a system.

FIG. 1 is a schematic side cross-sectional view of a system 100 including an Integrated Circuit (IC) 110. The IC 110 may be associated with, for example, an INTEL® PENTIUM IV processor. To help remove heat generated by the IC 110, a liquid coolant (not separately shown) may be circulated through a microchannel cold plate 120. The microchannel cold plate 120 may be located proximate to the IC 110 to facilitate the removal of heat from the system 100. The microchannel cold plate 120 may, for example, be thermally coupled to the IC 110 by a thermal interface material (TIM) 130. (In some cases, the TIM 130 may be omitted and the microchannel cold plate 120 may be directly thermally coupled to the IC 110. In some cases a rear side of the IC 110 may be thinned to reduce thermal resistance between the IC 110 and the microchannel cold plate 120, which may be coupled to the rear side of the IC 110.) Heat may be transferred from the IC 110 to the coolant, which may then leave the system 100. For example, the coolant may exit from the microchannel cold plate 120 via an outlet tube 140 and may be circulated to a heat exchanger (not shown) and then to a pump (not shown). The heat exchanger may for example include a length of tube with heat-conductive fins (not shown) mounted thereon and a fan (not shown) to direct air through the fins. Heat transferred to the coolant in the microchannel cold plate 120 may be dissipated at the heat exchanger. After passing through the heat exchanger and the pump, the coolant may flow back to the microchannel cold plate 120 via an inlet tube 150.

The microchannel cold plate 120 may be formed from a microchannel structure 160, in which microchannels (not separately shown in FIG. 1) are formed, and a cover lid 170 which is positioned on the microchannel structure 160 and which closes the top of the microchannels. The system 100 also includes a manifold plate 180 which is mounted on the cover lid 170 and functions to facilitate connection of the tubes 140, 150 to the microchannel cold plate 120.

In some aspects, the cover lid 160 may be considered part of the microchannel structure and the manifold plate 180 may be considered a cover on the microchannel structure.

The coolant may be water, or a liquid antifreeze compound that has a lower freezing point than water, or an aqueous solution of such a compound.

Figure 2:
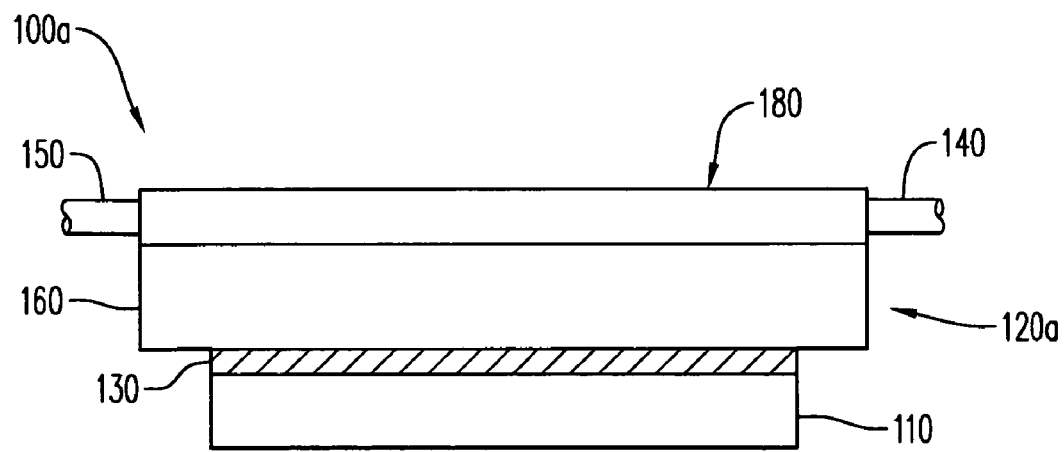
FIG. 2 is a schematic side cross-sectional view of another embodiment of a system.

FIG. 2 is a view similar to FIG. 1, showing another embodiment of the system. In this embodiment, labeled 100a, the cover lid and the manifold plate shown in FIG. 1 are integrated into a single member, labeled 180 in FIG. 2, and functioning as a cover for the microchannel structure 160.

Figure 3:
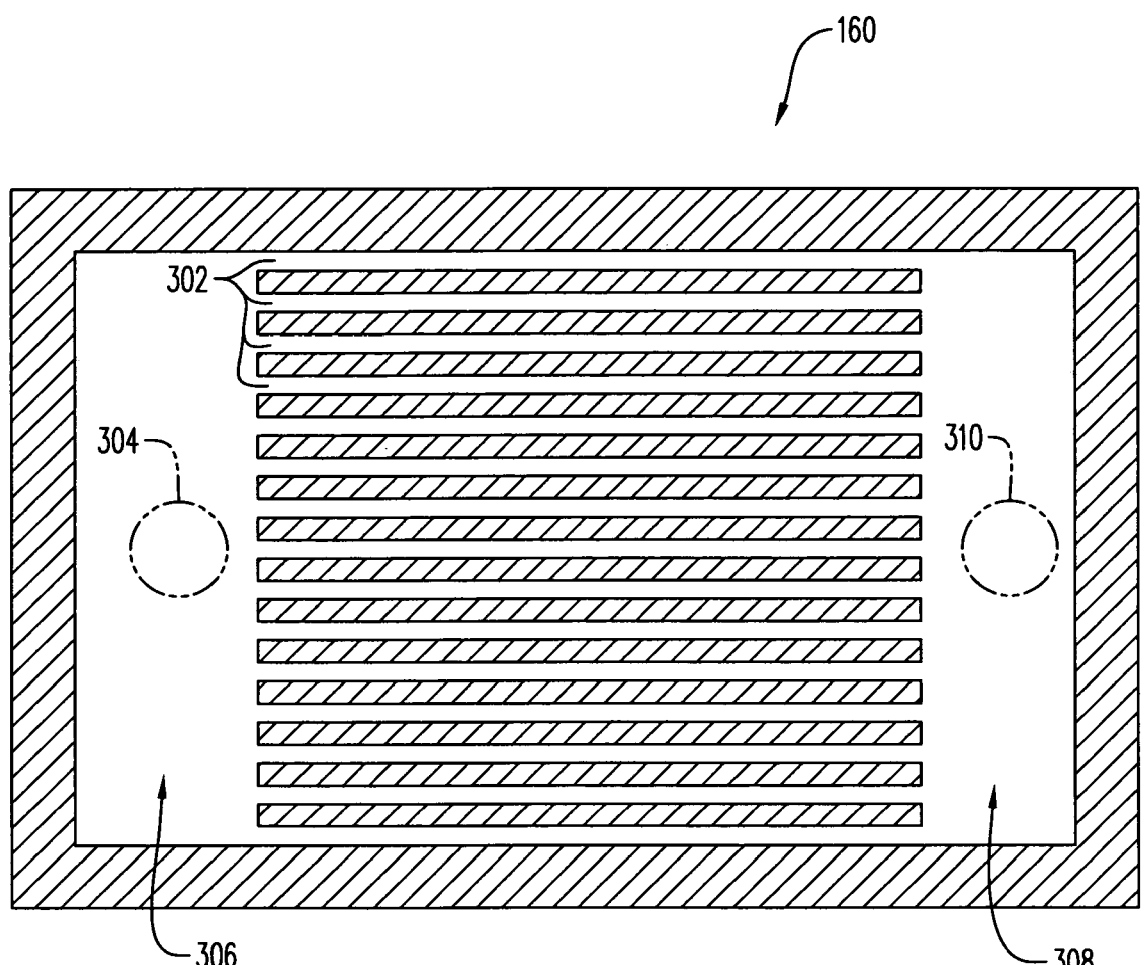
FIG. 3 is a schematic horizontal cross-sectional view of a microchannel structure that is part of the systems of FIGS. 1 or 2.

FIG. 3 is a schematic view taken in horizontal cross-section of the microchannel structure 160 according to some embodiments. FIG. 3 shows parallel microchannels 302 formed in the microchannel structure 160. (The number of microchannels may be more or fewer than the number illustrated in FIG. 3, and the drawing is not necessarily to scale. The microchannels need not be configured as shown in FIG. 3. For example, alternative microchannel configurations are shown in co-pending commonly-assigned patent application Ser. No. 11/101,061, filed Apr. 7, 2005.)

Coolant (not shown) flows to the microchannels 302 via an inlet port 304 (shown in phantom and formed in the cover lid or manifold plate, which are not shown in FIG. 3) and an inlet plenum 306. The coolant flows out of the microchannels 302 via an outlet plenum 308 and an outlet port 310 (shown in phantom and formed in the cover lid or manifold plate).

Figure 4:
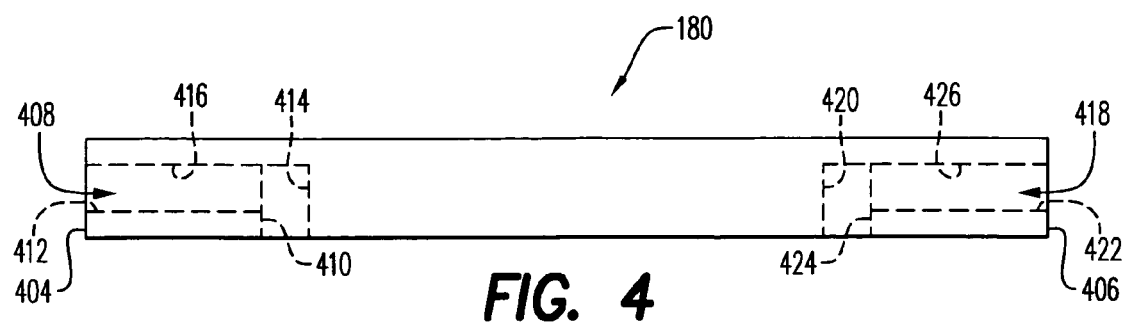
FIG. 4 is a schematic side cross-sectional view of a manifold plate that is part of the systems of FIGS. 1 or 2.

FIG. 4 is a schematic side cross-sectional view showing some details of the manifold plate 180. (Other details of the manifold plate are omitted from FIG. 4.) The manifold plate 180 has a lower horizontal surface 402, a left side vertical surface 404 and a right side vertical surface 406. (As used herein and in the appended claims, a "vertical surface" should be understood to include any surface that departs substantially from the horizontal; and "horizontal" refers to any direction normal to the direction from the microchannel assembly to the IC.)

The manifold plate 180 has formed therein an inlet passage 408. The inlet passage 408 provides fluid communication between a port 410 on the lower horizontal surface 402 of the manifold plate 180 and a port 412 on the left side vertical surface 404. The inlet passage 408 is a right-angle passage in that it is formed of a vertical course 414 and a horizontal course 416 that joins the vertical course 414 at a right angle. (More generally, as used herein and in the appended claims, "right-angle passage" refers to any passage that supports at least an 85° change in flow direction there through.)

The manifold plate 180 also has formed therein an outlet passage 418. The outlet passage 418 provides fluid communication between a port 420 on the lower horizontal surface 402 of the manifold plate 180 and a port 422 on the right side vertical surface 406. The outlet passage 418 is a right-angle passage in that it is formed of a vertical course 424 and a horizontal course 426 that joins the vertical course at a right angle.

Figure 5:
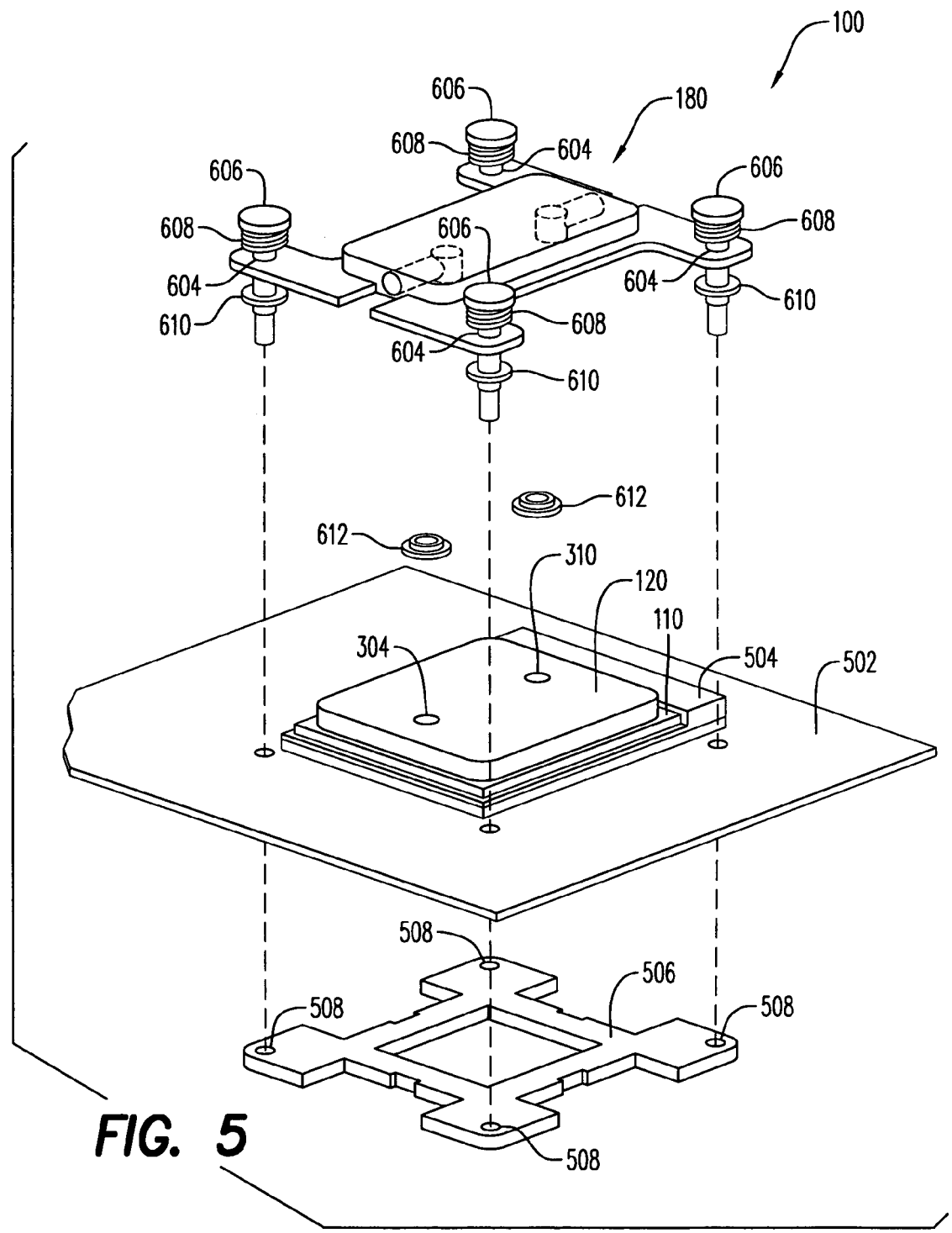
FIG. 5 is an exploded view showing more details of the system of FIG. 1.
Figure 6:
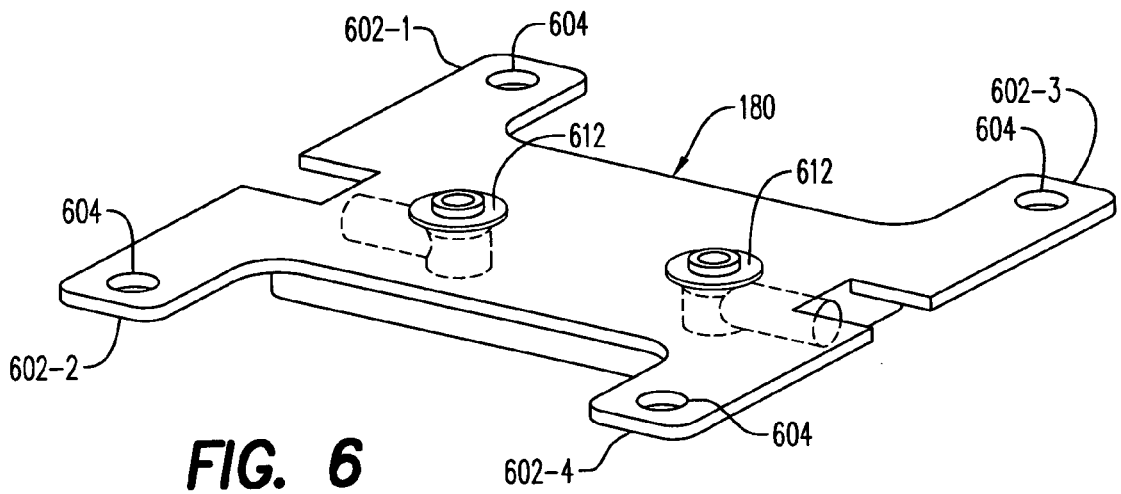
FIG. 6 is an isometric view showing the manifold plate of FIG. 4 in more detail.

FIG. 5 is an exploded view showing more details of the system 100. FIG. 5 shows a circuit board 502 and a socket 504 mounted on the circuit board 502. The package of the IC 110 is shown installed in the socket 504. The microchannel cold plate 120 is shown positioned on the IC 100. Shown spaced above the microchannel cold plate 120 is the manifold plate 180. As best seen in FIG. 6 (which is an isometric view of the manifold plate 180 seen from below), the manifold plate 180 has four tabs 602, each of which extends from a respective corner of the manifold plate 180. In particular, tabs 602-1 and 602-2 are aligned with each other and extend in opposite directions from each other, along a common line, from adjacent corners of the manifold plate 180. In addition tabs 602-3 and 602-4 are aligned with each other and extend in opposite directions from each other, along a common line, from adjacent corners of the manifold plate 180. It will be observed that the tabs 602 all share an orientation in that the longitudinal axes of the tabs are all parallel to, or coincident with, each other. All of the tabs 602 lie in a common plane.

Each of the tabs 602 has a respective aperture 604 formed at an outer end of the tab. Each aperture is shaped and sized to receive a fastener, such as the screws 606 shown installed in the tabs 602 in FIG. 5. Continuing to refer to FIG. 5, a respective spring 608 and a respective backing washer 610 are installed on each of the screws 606.

Figure 7:
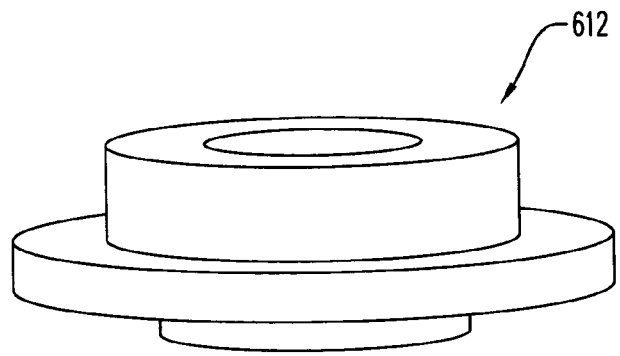
FIG. 7 is an isometric view showing on a larger scale a grommet which also appears in FIG. 6.

A pair of grommets 612 are provided to seal the ports 410, 420 (FIG. 4, not visible in other drawings) on the lower horizontal surface 402 (FIG. 6) of the manifold plate 180 to the ports 304, 310 (FIGS. 5 and 3) on the microchannel cold plate 120, respectively. (FIG. 7 shows one of the grommets 612 on a larger scale. Each grommet may be formed of a suitable rubber, elastomer or plastic material.)

The system 100 also includes a backing plate 506 (FIG. 5) which may be secured to the floor (not shown) of a personal computer chassis (not shown) to allow for suitable installation of the system 100. The backing plate 506 is generally shaped as a planar hollow square with corner extensions that each include a receptacle 508 to receive the tip of a respective one of the screws 606. By threadedly engaging the screws 606 in the receptacles 508 and tightening the screws 606 against the force of the springs 608, the manifold plate 180 and the microchannel cold plate 120 may be clamped down onto the circuit board 502 and the IC 110 to assure good thermal coupling of the microchannel cold plate 120 to the IC 110 and positive sealing (via the grommets) of the ports on the bottom of the manifold plate 180 to the ports in the cover lid (not separately indicated in FIG. 5) of the microchannel cold plate 120.

Figure 8:
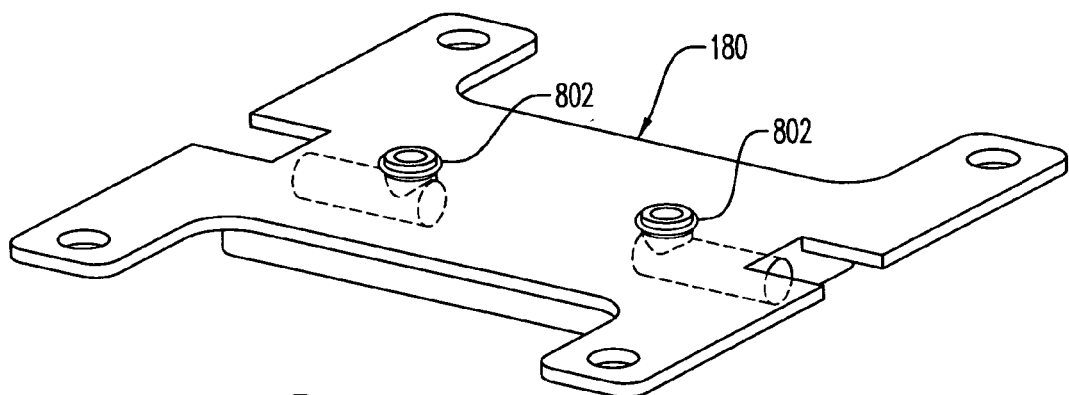
FIG. 8 is a view similar to FIG. 6, showing the manifold plate with O-rings instead of grommets.
Figure 9:
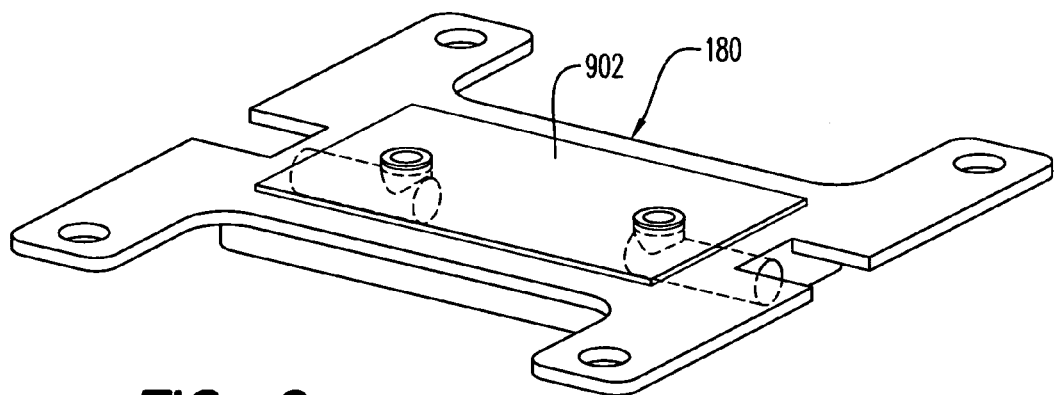
FIG. 9 is a view similar to FIGS. 6 and 8, showing the manifold plate with a gasket instead of grommets or O-rings.

FIG. 8 is a view similar to FIG. 6, showing that O-rings 802 may be substituted for the grommets 612 that were previously referred to. Similarly, FIG. 9 shows that a gasket 902 (to be sandwiched between the microchannel cold plate 120 and the manifold plate 180) may be employed in place of the grommets or O-rings. All of these arrangements may be advantageous by supporting re-workability, i.e., comparatively convenient disassembly, if required, of the manifold from the microchannel cold plate.

Figure 10:
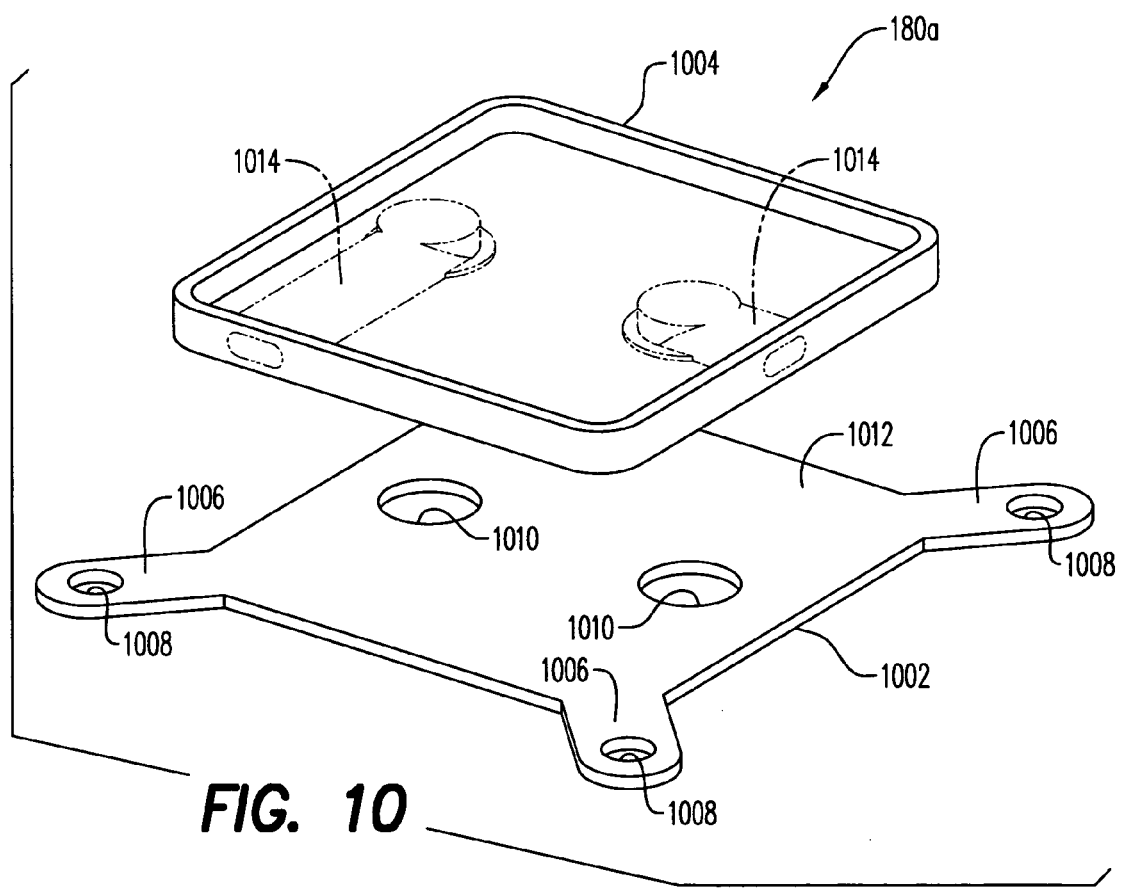
FIG. 10 is an exploded view showing another embodiment of the manifold plate.

FIG. 10 is an exploded view showing another embodiment of the manifold plate, now labeled 180a. As seen from FIG. 10, the manifold plate 180 may be composed of a metal base plate 1002 and a molded plastic component 1004. The base plate 1002 may be generally square and planar, with four tabs 1006 (only 3 visible in the drawing) each extending radially outwardly from a respective corner of the base plate 1002. An aperture 1008 to receive a respective fastener (not shown) is formed at the end of each of the tabs 1006. Holes 1010 are formed in the main body 1012 of the base plate 1002.

The molded plastic component 1004 has right angle passages 1014 (shown in phantom) formed therein. The component 1004 allows for low cost manufacture of the manifold plate 180a, while the base plate 1002 may be formed of high strength steel or the like to promote overall strength of the manifold plate 180a. The molded plastic component 1004 may be secured to the base plate 1002 by a suitable adhesive (not shown). The manifold plate 180a shown in FIG. 10 may be used in place of the manifold plate 180 in the systems 100 (FIG. 1) or 100a (FIG. 2).

Figure 11:
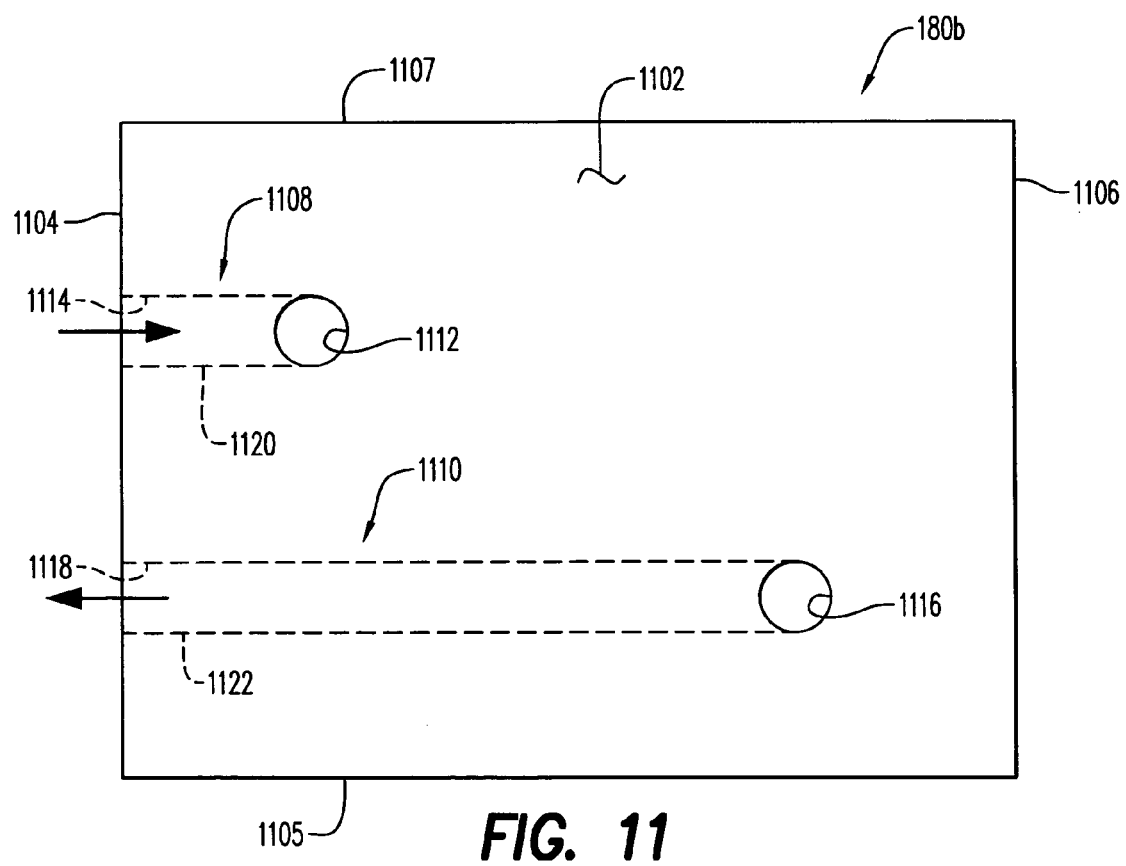
FIG. 11 is an inverted schematic plan view of still another embodiment of the manifold plate.

FIG. 11 is an inverted schematic plan view of still another embodiment of the manifold plate, now labeled 180b. The lower horizontal surface 1102 of the manifold plate 180b is shown in FIG. 11. Indicated at 1104 is a left side vertical surface of the manifold plate 180b; a right side vertical surface (facing in the opposite direction from surface 1104) of the manifold plate 180b is indicated at 1106. The manifold plate 180b also has a near side vertical surface 1105 and a far side vertical surface 1107. The manifold plate 180b has an inlet right-angle passage 1108 and an outlet right-angle passage 1110. The inlet right-angle passage 1108 provides fluid communication between a port 1112 on the lower horizontal surface 1102 and a port 1114 on the left side vertical surface 1104; the outlet right-angle passage 1110 provides fluid communication between a port 1116 on the lower horizontal surface 1102 and a port 1118 on the left side vertical surface 1104. The inlet right-angle passage 1108 has a horizontal course 1120 (indicated in phantom) that runs from port 1114 in the direction toward port 1112; the outlet right-angle passage 1110 has a horizontal course 1122 (indicated in phantom) that runs from port 1118 in the direction toward port 1116. (It will be appreciated that the outlet right-angle passage 1110 may alternatively be used as an inlet for coolant, with the inlet right-angle passage 1108 serving as an outlet for coolant.)

As shown in FIG. 11, the port 1116 is spaced from the left side vertical surface 1104 by a greater distance than is the port 1112. In some embodiments, the port 1116 may be spaced from the right side vertical surface 1106 by a distance that is substantially equal to the distance that the port 1112 is spaced from the left side vertical surface 1104. It will be observed that the horizontal course 1122 of the right-angle passage 1110 is longer than the horizontal course 1120 of the right-angle passage 1108, and that the two horizontal courses run parallel to each other. Moreover, the shortest distance between port 1112 and left side vertical surface 1104 is less than the shortest distance between port 1116 and left side vertical surface 1104, and the shortest distance between port 1112 and far side vertical surface 1107 is less than the shortest distance between port 1116 and far side vertical surface 1107. (As used herein and in the appended claims, a "vertical surface" should be understood to include any surface that departs substantially from the horizontal; and "horizontal" refers to any direction normal to the direction from the microchannel cold plate to the IC.)

The manifold plate 180b shown in FIG. 11 may be used in place of the manifold plate 180 in the systems 100 (FIG. 1) or 100a (FIG. 2). (It is assumed that the ports in the cover lid 170—FIG. 1—are positioned to match the staggered positions of the ports 1112, 1116 of the manifold plate 180b.)

With the arrangement of ports and right-angle passages shown in FIG. 11, inlet and outlet tubes (not shown in FIG. 11) may be attached to the microchannel cold plate from the same direction, while allowing the coolant to flow from one end of the cold plate to the other. This may allow for convenient "plumbing" to the microchannel cold plate.

The several embodiments described herein are solely for the purpose of illustration. The various features described herein need not all be used together, and any one or more of those features may be incorporated in a single embodiment. Therefore, persons skilled in the art will recognize from this description that other embodiments may be practiced with various modifications and alterations.

What is claimed is:

1. A system comprising:
    a circuit board;
    a socket mounted on the circuit board;
    a microprocessor integrated circuit die package installed in the socket;
    a microchannel structure thermally coupled to the microprocessor integrated circuit die package, the microchannel structure having microchannels formed therein, said microchannels to transport a coolant and to be proximate to the integrated circuit die package to transfer heat from the integrated circuit die package to the coolant;
    a cover positioned on the microchannel structure and above the circuit board and having formed therein a right-angle passage to provide fluid communication between a first port on a lower horizontal surface of said cover and a second port on a vertical surface of said cover, said cover including a plurality of tabs, each extending from a respective corner of said cover, said tabs each having an aperture formed therein;
    a backing plate below the circuit board and having a plurality of receptacles formed therein; and
    a plurality of screws for securing the cover to the backing plate each of said screws installed in a respective one of the apertures of the cover and threadedly engaged in a respective one of the receptacles of the backing plate.

2. The system of claim 1, wherein said right-angle passage is a first right-angle passage and said vertical surface is a first vertical surface;
    said cover also having formed therein a second right-angle passage to provide fluid communication between a third port on said lower horizontal surface of said cover and a fourth port on a second vertical surface of said cover, said second vertical surface being different from said first vertical surface.

3. The system of claim 2, wherein said cover includes a metal base plate in which said tabs are formed and a molded plastic piece secured to said base plate and having said right-angle passages formed therein.

4. The system of claim 1, wherein the plurality of tabs include four tabs.

5. The system of claim 4, wherein the four tabs all share an orientation.

6. The system of claim 4, wherein each of the tabs extends radially outwardly from its respective corner of said cover.

7. The system of claim 1, further comprising:
    a gasket sandwiched between the microchannel structure and the cover.

8. The system of claim 1, further comprising a pair of grommets sandwiched between the microchannel structure and the cover.

* * * * *

UNITED STATES PATENT AND TRADEMARK OFFICE
CERTIFICATE OF CORRECTION

PATENT NO. : 7,272,006 B2
APPLICATION NO. : 11/239957
DATED : September 18, 2007
INVENTOR(S) : Mongia et al.

It is certified that error appears in the above-identified patent and that said Letters Patent is hereby corrected as shown below:

Col. 5, line 15, should read:

1. A system comprising:
   a circuit board;
   a socket mounted on the circuit board;
   a microprocessor integrated circuit die package installed in the socket;
   a microchannel structure thermally coupled to the microprocessor integrated circuit die package, the microchannel structure having microchannels formed therein, said microchannels to transport a coolant and to be proximate to the integrated circuit die package to transfer heat from the integrated circuit die package to the coolant;
   a cover positioned on the microchannel structure and above the circuit board and having formed therein a right-angle passage to provide fluid communication between a first port on a lower horizontal surface of said cover and a second port on a vertical surface of said cover, said cover including a plurality of tabs, each extending from a respective corner of said cover, said tabs each having an aperture formed therein;
   a backing plate below the circuit board and having a plurality of receptacles formed therein; and
   a plurality of screws for securing the cover to the backing plate, each of said screws installed in a respective one of the apertures of the cover and threadedly engaged in a respective one of the receptacles of the backing plate.

Signed and Sealed this

Twenty-fifth Day of March, 2008

JON W. DUDAS
*Director of the United States Patent and Trademark Office*